(12) United States Patent
Yoneyama et al.

(10) Patent No.: US 10,077,890 B2
(45) Date of Patent: Sep. 18, 2018

(54) LIGHT-EMITTING DEVICE

(71) Applicant: Konica Minolta, Inc., Tokyo (JP)

(72) Inventors: Masatoshi Yoneyama, Izumi (JP); Nobuya Miki, Ibaraki (JP); Yasuhiro Sando, Amagasaki (JP); Junya Wakahara, Yokohama (JP)

(73) Assignee: KONICA MINOLTA, INC., Tokyo (JP)

( * ) Notice: Subject to any disclaimer, the term of this patent is extended or adjusted under 35 U.S.C. 154(b) by 52 days.

(21) Appl. No.: 15/509,724

(22) PCT Filed: Jul. 29, 2015

(86) PCT No.: PCT/JP2015/071444
§ 371 (c)(1),
(2) Date: Mar. 8, 2017

(87) PCT Pub. No.: WO2016/042921
PCT Pub. Date: Mar. 24, 2016

(65) Prior Publication Data
US 2017/0299156 A1 Oct. 19, 2017

(30) Foreign Application Priority Data
Sep. 16, 2014 (JP) .................. 2014-187821

(51) Int. Cl.
*F21V 19/00* (2006.01)
*H01L 25/16* (2006.01)
(Continued)

(52) U.S. Cl.
CPC ........ *F21V 19/0015* (2013.01); *H01L 25/048* (2013.01); *H01L 25/16* (2013.01);
(Continued)

(58) Field of Classification Search
CPC ..... F21V 19/0015; H01L 25/048; H01L 25/16
See application file for complete search history.

(56) References Cited

U.S. PATENT DOCUMENTS

2013/0168647 A1 7/2013 Diekmann et al.

FOREIGN PATENT DOCUMENTS

JP 2007149465 A 6/2007

OTHER PUBLICATIONS

Extended European Search Report dated May 4, 2018 from corresponding European Application No. EP 15841835.0.
(Continued)

*Primary Examiner* — Joseph L Williams
(74) *Attorney, Agent, or Firm* — Lucas & Mercanti, LLP

(57) ABSTRACT

A light-emitting device includes a surface-light-emitting unit, a substrate, a holding sheet, and a sealing sheet. The surface-light-emitting unit has a light-emitting surface and a non-light-emitting surface, and emits light from the light-emitting surface. The substrate has a mounting surface and a non-mounting surface provided to be flush with the light-emitting surface, and has a power source mounted on the mounting surface. The holding sheet is provided to face the non-mounting surface and the light-emitting surface provided to be flush with the non-mounting surface. The sealing sheet is disposed on the side opposite to the holding sheet with respect to the surface-light-emitting unit and the substrate, and provided to cover the surface-light-emitting unit and the power source. The light-emitting device is disposed so that the holding sheet comes to the installation surface side. With such a structure, the light-emitting device that can be stably disposed on the installation surface is provided.

18 Claims, 2 Drawing Sheets

(51) Int. Cl.
  *H01L 25/04*   (2014.01)
  *H01L 51/52*   (2006.01)
  *F21Y 115/20*  (2016.01)
  *F21V 23/00*   (2015.01)
  *F21Y 105/10*  (2016.01)

(52) U.S. Cl.
  CPC .......... *H01L 51/5246* (2013.01); *F21V 23/00* (2013.01); *F21Y 2105/10* (2016.08); *F21Y 2115/20* (2016.08); *H01L 2251/5338* (2013.01)

(56) References Cited

OTHER PUBLICATIONS

International Search Report dated Oct. 20, 2015 for PCT/JP2015/071444; English translation of International Search Report; Total of 4 pages.

LIGHT-EMITTING DEVICE

CROSS REFERENCE TO RELATED APPLICATION

This Application is a 371 of PCT/JP2015/071444 filed on Jul. 29, 2015 which, in turn, claimed the priority of Japanese Application No. 2014-187821 filed on Sep. 16, 2014, both applications are incorporated herein by reference.

TECHNICAL FIELD

The present invention generally relates to a light-emitting device, more particularly to a light-emitting device installed on an installation surface.

BACKGROUND ART

In regard to conventional light-emitting devices, for example, JP 2007-149465 A has disclosed the luminaire. This luminaire is formed using a light-emitting panel including an organic EL element but maintains the good appearance (Patent Literature 1).

The luminaire according to Patent Literature 1 includes: the light-emitting panel including the organic EL element; the lighting device that supplies a driving voltage to the light-emitting panel; and the luminaire main body that holds the light-emitting panel and the lighting device. The luminaire main body includes the housing to house the lighting device. The housing is disposed aside with respect to the light-emitting surface of the light-emitting panel, and the light-emitting surface of the light-emitting panel and the front surface of the housing are made almost flush.

CITATION LIST

Patent Literature

Patent Literature 1: JP 2007-149465 A

SUMMARY OF INVENTION

Technical Problem

Patent Literature 1 has disclosed the light-emitting device including the surface-light-emitting unit such as the organic EL. Such a light-emitting device is provided with an electronic component, for example a power source for supplying electric power to the surface-light-emitting unit, a control component for controlling the light emission of the surface-light-emitting unit, or a communication component used for external communication.

Here, it is assumed that the light-emitting device is installed by being attached to an installation surface such as a designed sheet. In this case, the electronic component causes the unevenness and a space may be formed between the light-emitting device and the installation surface. This results in a problem that the light-emitting device cannot be installed stably on the installation surface.

In view of the above, it is an object of the present invention to solve the above problem and to provide a light-emitting device that can be stably installed on the installation surface.

Solution to Problem

A light-emitting device according to one aspect of the present invention is a light-emitting device to be installed on an installation surface. The light-emitting device includes a surface-light-emitting unit, a base member, a first sheet, and a second sheet. The surface-light-emitting unit has a light-emitting surface and a non-light-emitting surface which is disposed on the back side of the light-emitting surface, and emits light from the light-emitting surface. The base member has a first surface and a second surface which is disposed on the back side of the first surface and which is provided to be flush with one of the light-emitting surface and the non-light-emitting surface, and has an electronic component mounted on the first surface. The first sheet is provided to face the second surface and one of the light-emitting surface and the non-light-emitting surface provided to be flush with the second surface. The second sheet is disposed on the side opposite to the first sheet with respect to the surface-light-emitting unit and the base member, and provided to cover the surface-light-emitting unit and the electronic component. The light-emitting device is disposed so that the first sheet comes to the installation surface side.

Advantageous Effects of Invention

According to the present invention, a light-emitting device that can be stably installed on an installation surface can be provided.

DESCRIPTION OF EMBODIMENTS

Embodiments of the present invention will be described with reference to the drawings. Throughout the drawings, the same or corresponding components are denoted by the same reference sign.

(First Embodiment)

Figure 1:
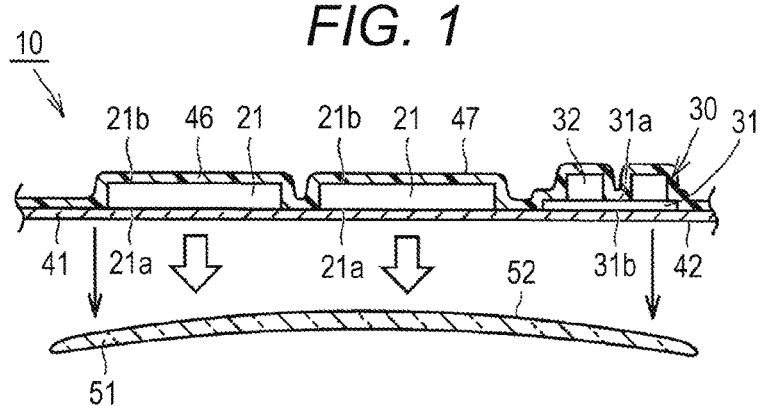
FIG. 1 is a sectional view illustrating a light-emitting device according to a first embodiment of the present invention.

FIG. 1 is a sectional view illustrating a light-emitting device according to a first embodiment of the present invention. In FIG. 1, a light-emitting device 10 according to this embodiment is illuminating means with a thin-plate shape. The light-emitting device 10 is installed on an installation surface 52 of an installation member 51 such as a designed sheet. The light-emitting device 10 is attached to the installation surface 52.

In this embodiment, the installation surface 52 is formed as a curved surface. The light-emitting device 10 is flexible and can be deformed along the shape of the installation surface 52.

The light-emitting device 10 includes a plurality of surface-light-emitting units 21. The surface-light-emitting unit 21 is provided as light-emitting means extending in the plane shape. The light-emitting device 10 is configured to be able to emit light in a wide range because the plurality of surface-light-emitting units 21 is arrayed in the flat plane shape.

The surface-light-emitting unit 21 includes a light-emitting surface 21a and a non-light-emitting surface 21b. The surface-light-emitting unit 21 emits light from the light-emitting surface 21a. The non-light-emitting surface 21b is disposed on the back side of the light-emitting surface 21a. The light-emitting surface 21a and the non-light-emitting surface 21b have the flat plane shape, and their shapes are parallel to each other.

Figure 2:
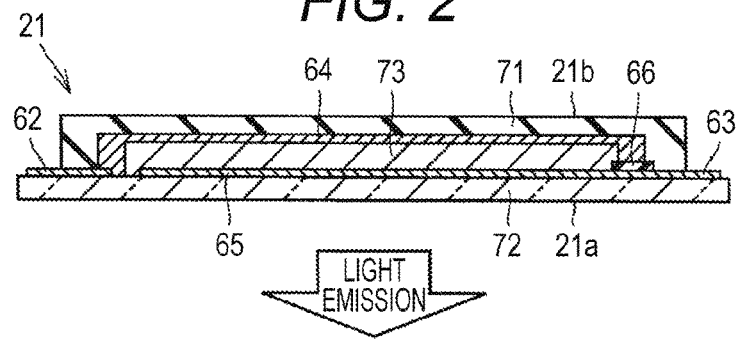
FIG. 2 is a sectional view illustrating a surface-light-emitting unit in FIG. 1.

FIG. 2 is a sectional view illustrating the surface-light-emitting unit in FIG. 1. In FIG. 2, in this embodiment, the surface-light-emitting unit 21 includes the organic EL, and is formed to be flexible and bendable as a whole. The surface-light-emitting unit 21 may be configured by a light-emitting diode (LED) and a diffuser plate, or may alternatively be configured by a cold cathode tube or the like.

The surface-light-emitting unit 21 includes a transparent substrate 72, an anode (anode) 65, an organic layer 73, a cathode (cathode) 64, a sealing member 71, and an insulating layer 66.

The transparent substrate 72 is disposed on the light-emitting surface 21a side of the surface-light-emitting unit 21. The anode 65, the organic layer 73, and the cathode 64 are sequentially stacked on the transparent substrate 72. The sealing member 71 is provided to cover a stack of the anode 65, the organic layer 73, and the cathode 64.

The transparent substrate 72 is formed using a flexible transparent member. The material is, for example, a light-transmitting film substrate of polyethylene terephthalate (PET), polycarbonate (PC), or the like.

The light-transmitting film substrate may alternatively be formed of polyimide, polyethylene naphthalate (PEN), polystyrene (PS), polyether sulfone (PES), polypropylene (PP), or the like.

The anode 65 is a conductive film with transparency. The anode 65 is formed by depositing ITO (Indium Tin Oxide: indium tin oxide) or the like as a film on the transparent substrate 72 by a sputtering method or the like. Alternatively, the anode 65 may be formed using polyethylenedioxythiophene (PEDOT).

The organic layer 73 can generate light (visible light) when electric power is supplied. The organic layer 73 maybe formed of a single light-emitting layer or may be formed by sequentially stacking a hole transport layer, a light-emitting layer, a hole block layer, an electron transport layer, and the like.

The cathode 64 is formed of, for example, aluminum (Al). The cathode 64 is formed to cover the organic layer 73 by a vacuum deposition method or the like. For patterning the cathode 64 in a predetermined shape, a mask is preferably used in the vacuum deposition. The cathode 64 may alternatively be formed of lithium fluoride (LiF), a stack of Al and Ca, a stack of Al and LiF, a stack of Al and Ba, or the like.

To prevent the short-circuiting between the cathode 64 and the anode 65, an insulating layer 66 is provided between the cathode 64 and the anode 65. The insulating layer 66 is formed by, for example, deposing $SiO_2$ or the like as a film by a sputtering method and then performing the pattern formation as desired by a photolithography method or the like so as to cover the area where the anode 65 and the cathode 64 are to be insulated from each other.

The sealing member 71 is disposed on the non-light-emitting surface 21b side of the surface-light-emitting unit 21. The sealing member 71 is formed of a resin with the insulating property. The sealing member 71 is formed to protect the organic layer 73 from moisture or the like. The sealing member 71 seals the anode 65, the organic layer 73, and the cathode 64 on the transparent substrate 72. Note that a part of the anode 65 is exposed from the sealing member 71 for the electric connection.

The sealing member 71, which has the gas barrier property, is formed by overlaying a plurality of layers including an inorganic thin film such as $SiO_2$, $Al_2O_3$, or $SiN_x$ and a soft acrylic resin thin film on a film of PET, PEN, PS, PES, polyimide, or the like.

The part of the anode 65 that is exposed from the sealing member 71 (the right part in FIG. 2) constitutes an electrode portion 63 (for anode). The electrode portion 63 and the anode 65 are formed of the same material. The part of the cathode 64 that is exposed from the sealing member 71 (the left part in FIG. 2) constitutes an electrode portion 62 (for cathode). The electrode portion 62 and the cathode 64 are formed of the same material. To the electrode portion 63 and the electrode portion 62, wires (not shown) are attached using solder or silver paste. On the portion where the wires are attached, a resin agent maybe applied in order to maintain the water resistance and the weather resistance. The surface-light-emitting unit 21 is electrically connected through the wire to a power source 32 to be described below.

To the organic layer 73 of the surface-light-emitting unit 21, the electric power is supplied from the power source 32 through the wires (not shown), the electrode portions 63 and 62, the anode 65, and the cathode 64. The light generated in the organic layer 73 by the power supply goes through the anode 65 and the transparent substrate 72 and is extracted from the light-emitting surface 21a to the outside.

In FIG. 1, the light-emitting device 10 further includes a substrate 31, and the power source 32 mounted on the substrate 31. In this embodiment, the substrate 31 includes a flexible wired substrate and has flexibility. The substrate 31 and the power source 32 constitute a power source circuit unit 30 for supplying the electric power to the surface-light-emitting unit 21. Note that the substrate 31 may alternatively be formed using a hard wired substrate.

The substrate 31 has a mounting surface 31a and a non-mounting surface 31b. The power source 32 is mounted on the mounting surface 31a. The non-mounting surface 31b is disposed on the back side of the mounting surface 31a. The power source 32 is provided to protrude from the mounting surface 31a.

The power source circuit unit 30 is arrayed in the plane shape with the plurality of surface-light-emitting units 21. In other words, in the plan view of the light-emitting device 10 with the thin-plate shape, the power source circuit unit 30 does not overlap with the plurality of surface-light-emitting units 21. The power source circuit unit 30 is provided beside the surface-light-emitting unit 21.

The power source circuit unit 30 is provided so that the non-mounting surface 31b is flush with one of the light-emitting surface 21a and the non-light-emitting surface 21b of the surface-light-emitting unit 21. In this embodiment, the power source circuit unit 30 is provided so that the non-mounting surface 31b is flush with the light-emitting surface 21a of the surface-light-emitting unit 21. With respect to the substrate 31, the power source 32 is mounted on the mounting surface 31a, which is on the side opposite to the light-emitting surface 21a of the surface-light-emitting unit 21.

The substrate 31 is the substrate for the power source circuit in this embodiment; however, the substrate 31 may be a light emission control substrate for controlling the lighting, the blinking, the emission color, the luminance, or the like of the surface-light-emitting unit 21, or a signal communication substrate for communicating with the outside.

Since the power source 32 generates heat, a metal sheet with heat conductivity may be placed on the non-mounting surface 31b side of the substrate 31. In this case, the power source circuit unit 30 is provided so that the surface of the metal sheet is flush with the light-emitting surface 21a of the surface-light-emitting unit 21.

The light-emitting device 10 further includes a holding sheet 41 and a sealing sheet 46. Each of the holding sheet 41 and the sealing sheet 46 is formed using a single flexible sheet material. The holding sheet 41 and the sealing sheet 46 are formed of the resin sheet material. Examples of the material include polyethylene terephthalate (PET), polycarbonate (PC), polyimide, polyethylene naphthalate (PEN), polystyrene (PS), polyether sulfone (PES), and polypropylene (PP).

In this embodiment, of the holding sheet 41 and the sealing sheet 46, at least the holding sheet 41 has the light-transmitting property.

The holding sheet 41 and the sealing sheet 46 overlap with each other in the state that the plurality of surface-light-emitting units 21 and the power source circuit unit 30 are held between the holding sheet 41 and the sealing sheet 46. The holding sheet 41 and the sealing sheet 46 are bonded using an OCA film (Optical Clear Adhesive Film), a transparent adhesive, or the like.

The holding sheet 41 is provided to face the non-mounting surface 31b of the substrate 31 and the light-emitting surface 21a of the surface-light-emitting unit 21 provided to be flush with the non-mounting surface 31b. The power source circuit unit 30 and the surface-light-emitting units 21 are held by the holding sheet 41 in the state that the non-mounting surface 31b and the light-emitting surface 21a are in surface contact with the holding sheet 41.

The sealing sheet 46 is disposed on the side opposite to the holding sheet 41 with respect to the plurality of surface-light-emitting units 21 and the power source circuit unit 30. The sealing sheet 46 is provided to integrally cover the plurality of surface-light-emitting units 21 and the power source circuit unit 30 from the side of the non-light-emitting surface 21b and the mounting surface 31a. The sealing sheet 46 together with the holding sheet 41 seal the plurality of surface-light-emitting units 21 and the power source circuit unit 30.

The structure in which the surface-light-emitting units 21 and the power source circuit unit 30 are sealed between the holding sheet 41 and the sealing sheet 46 eliminates the necessity of providing a component for individually supporting the surface-light-emitting unit 21. Therefore, the surface-light-emitting units 21 and the power source circuit unit 30 can be held stably while the light-emitting device 10 is reduced in thickness.

The light-emitting device 10 is installed on the installation member 51 so that, of the holding sheet 41 and the sealing sheet 46, the holding sheet 41 comes to the installation surface 52 side. The light-emitting device 10 is installed on the installation member 51 so that a surface 42 of the holding sheet 41 is in surface contact with the installation surface 52. The surface-light-emitting units 21 emit light toward the installation member 51 through the holding sheet 41.

In this embodiment, the light-emitting surface 21a of the surface-light-emitting unit 21 is provided to be flush with the non-mounting surface 31b of the substrate 31 where the power source 32 is not mounted. The holding sheet 41 is provided to face these surfaces.

With this structure, the holding sheet 41 does not have the unevenness, which would be caused by the power source 32, and can have the flat surface shape. On the other hand, a surface 47 of the sealing sheet 46 has the unevenness due to the power source 32. In view of this, the light-emitting device 10 is installed so that the holding sheet 41 with the flat surface shape comes to the installation surface 52 side. This will prevent the space from being formed between the light-emitting device 10 and the installation surface 52, and the thin light-emitting device 10 where the surface-light-emitting unit 21 and the power source circuit unit 30 are sealed can be installed stably.

Description is made of the summary of the above structure of the light-emitting device 10 according to the first embodiment of the present invention. The light-emitting device 10 according to this embodiment is installed on the installation surface 52. The light-emitting device 10 includes the surface-light-emitting units 21, the substrate 31 as a base member, the holding sheet 41 as a first sheet, and the sealing sheet 46 as a second sheet. The surface-light-emitting unit 21 has the light-emitting surface 21a and the non-light-emitting surface 21b disposed on the back side of the light-emitting surface 21a, and emits light from the light-emitting surface 21a. The substrate 31 has the mounting surface 31a as a first surface, and the non-mounting surface 31b as a second surface, which is disposed on the back side of the mounting surface 31a and provided to be flush with the light-emitting surface 21a as one of the light-emitting surface 21a and the non-light-emitting surface 21b. On the mounting surface 31a, the power source 32 corresponding to the electronic component is mounted. The holding sheet 41 is provided to face the non-mounting surface 31b and the light-emitting surface 21a as one of the light-emitting surface 21a and the non-light-emitting surface 21b provided to be flush with the non-mounting surface 31b. The sealing sheet 46 is disposed on the side opposite to the holding sheet 41 with respect to the surface-light-emitting units 21 and the substrate 31, and covers the surface-light-emitting units 21 and the power source 32. The light-emitting device 10 is provided so that the holding sheet 41 comes to the installation surface 52 side.

The light-emitting device 10 with the above structure according to the first embodiment of the present invention includes the holding sheet 41 with the flat surface shape not having the unevenness on the installation surface 52 side. Thus, the light-emitting device 10 can be stably installed on the installation surface 52. In this embodiment, the surface-light-emitting unit 21, the substrate 31, the holding sheet 41, and the sealing sheet 46 have the flexibility. Therefore, even if the installation surface 52 is formed as the curved surface, the light-emitting device 10 can be installed easily because the light-emitting device 10 is deformed along the curved shape of the installation surface 52.

Note that the installation surface 52 where the light-emitting device 10 is installed is not limited to the curved surface but may have a flat plane shape. In this case, the holding sheet 41 and the like may be formed of the sheet material without the flexibility.

(Second Embodiment)

Figure 3:
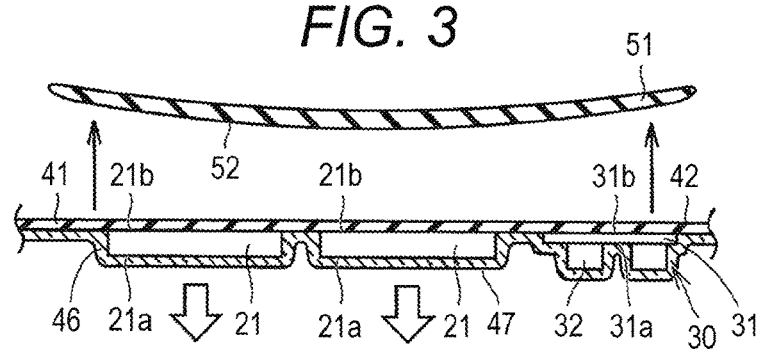
FIG. 3 is a sectional view illustrating a light-emitting device according to a second embodiment of the present invention.

FIG. 3 is a sectional view illustrating a light-emitting device according to a second embodiment of the present invention. The light-emitting device according to this embodiment has the structure basically similar to that of the light-emitting device 10 according to the first embodiment. The description on the overlapping structure will not be repeated.

In FIG. 3, the power source circuit unit 30 is provided so that the non-mounting surface 31b is flush with the non-light-emitting surface 21b of the surface-light-emitting unit 21 in this embodiment. The holding sheet 41 is provided to face the non-mounting surface 31b of the substrate 31 and the non-light-emitting surface 21b of the surface-light-emitting unit 21 provided to be flush with the non-mounting surface 31b. The sealing sheet 46 is provided to cover the plurality of surface-light-emitting units 21 and the power source circuit unit 30 from the side of the light-emitting surface 21a and the mounting surface 31a.

The light-emitting device according to this embodiment is installed on the installation member 51 so that, of the holding sheet 41 and the sealing sheet 46, the holding sheet 41 comes to the installation surface 52 side. Of the holding sheet 41 and the sealing sheet 46, at least the sealing sheet 46 has the light-transmitting property. The surface-light-emitting unit 21 emits light toward the space opposite to the installation member 51 through the sealing sheet 46.

The light-emitting device with the above structure according to the second embodiment of the present invention produces the effect similar to the effect described in the first embodiment.

(Third Embodiment)

Figure 4:
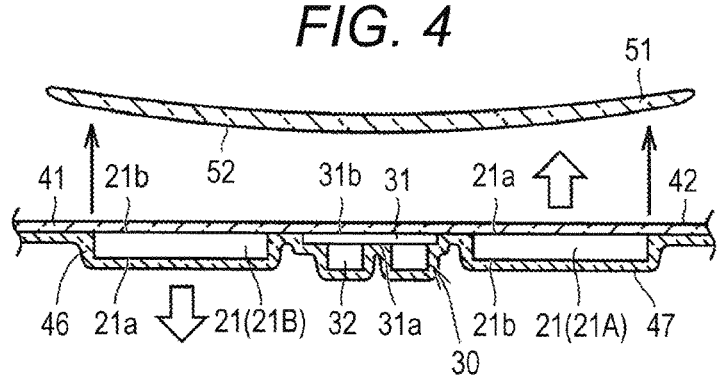
FIG. 4 is a sectional view illustrating a light-emitting device according to a third embodiment of the present invention.

FIG. 4 is a sectional view illustrating a light-emitting device according to a third embodiment of the present invention. The light-emitting device according to this embodiment has the structure basically similar to that of the light-emitting device 10 according to the first embodiment. The description on the overlapping structure will not be repeated.

In FIG. 4, the light-emitting device according to this embodiment includes a surface-light-emitting unit 21A and a surface-light-emitting unit 21B as the plurality of surface-light-emitting units 21.

The power source circuit unit 30 is provided so that the non-mounting surface 31b is flush with the light-emitting surface 21a of the surface-light-emitting unit 21A and the non-light-emitting surface 21b of the surface-light-emitting unit 21B. The holding sheet 41 is provided to face the non-mounting surface 31b of the substrate 31 and the light-emitting surface 21a of the surface-light-emitting unit 21A and the non-light-emitting surface 21b of the surface-light-emitting unit 21B, which are provided to be flush with the non-mounting surface 31b. The sealing sheet 46 is provided to cover the surface-light-emitting unit 21A, the surface-light-emitting unit 21B, and the power source circuit unit 30 from the side of the light-emitting surface 21b of the surface-light-emitting unit 21A, the light-emitting surface 21a of the surface-light-emitting unit 21B, and the mounting surface 31a of the substrate 31.

The light-emitting device according to this embodiment is installed on the installation member 51 so that, of the holding sheet 41 and the sealing sheet 46, the holding sheet 41 comes to the installation surface 52 side. Both the holding sheet 41 and the sealing sheet 46 have the light-transmitting property. The surface-light-emitting unit 21A emits light toward the installation member 51 through the holding sheet 41 and the surface-light-emitting unit 21B emits light toward the space opposite to the installation member 51 through the sealing sheet 46.

The light-emitting device with the above structure according to the third embodiment of the present invention produces the effect similar to the effect described in the first embodiment.

(Fourth Embodiment)

Figure 5:
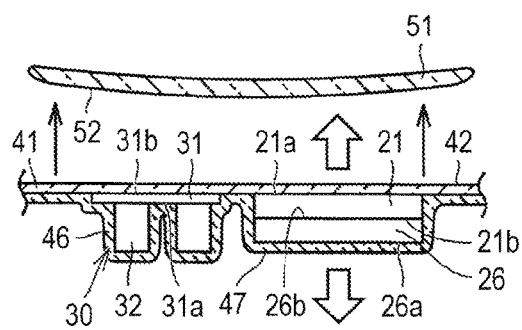
FIG. 5 is a sectional view illustrating a light-emitting device according to a fourth embodiment of the present invention.

FIG. 5 is a sectional view illustrating a light-emitting device according to a fourth embodiment of the present invention. The light-emitting device according to this embodiment has the structure basically similar to that of the light-emitting device 10 according to the first embodiment. The description on the overlapping structure will not be repeated.

In FIG. 5, the light-emitting device according to this embodiment includes a surface-light-emitting unit 26 in addition to the surface-light-emitting units 21 described in the first embodiment. The surface-light-emitting unit 26 has the same structure as the surface-light-emitting unit 21, and includes a light-emitting surface 26a and a non-light-emitting surface 26b corresponding to the light-emitting surface 21a and the non-light-emitting surface 21b, respectively.

The power source circuit unit 30 is provided so that the non-mounting surface 31b is flush with the light-emitting surface 21a of the surface-light-emitting unit 21. The surface-light-emitting unit 26 is stacked on the surface-light-emitting unit 21. The direction where the surface-light-emitting unit 21 and the surface-light-emitting unit 26 are stacked is the same as the direction where the holding sheet 41 and the sealing sheet 46 are stacked on each other. The surface-light-emitting unit 26 is stacked on the surface-light-emitting unit 21 so that the non-light-emitting surface 26b of the surface-light-emitting unit 26 faces the non-light-emitting surface 21b of the surface-light-emitting unit 21.

The holding sheet 41 is provided to face the non-mounting surface 31b of the substrate 31 and the light-emitting surface 21a of the surface-light-emitting unit 21 provided to be flush with the non-mounting surface 31b. The sealing sheet 46 is provided to cover the surface-light-emitting unit 21, the surface-light-emitting unit 26, and the power source circuit unit 30 from the side of the light-emitting surface 26a of the surface-light-emitting unit 26 and the mounting surface 31a of the substrate 31.

The light-emitting device according to this embodiment is installed on the installation member 51 so that, of the holding sheet 41 and the sealing sheet 46, the holding sheet 41 comes to the installation surface 52 side. Both the holding sheet 41 and the sealing sheet 46 have the light-transmitting property. The surface-light-emitting unit 21 emits light toward the installation member 51 through the holding sheet 41 and the surface-light-emitting unit 26 emits light toward the space opposite to the installation member 51 through the sealing sheet 46.

The light-emitting device with the above structure according to the fourth embodiment of the present invention produces the effect similar to the effect described in the first embodiment.

The light-emitting device according to one aspect of the present invention is the light-emitting device to be installed on the installation surface. The light-emitting device includes the surface-light-emitting unit, the base member, the first sheet, and the second sheet. The surface-light-emitting unit has the light-emitting surface and the non-light-emitting surface disposed on the back side of the light-emitting surface, and emits light from the light-emitting surface. The base member has a first surface and a second surface which is disposed on a back side of the first surface and which is flush with one of the light-emitting surface and the non-light-emitting surface. The base member has the electronic component mounted on the first surface. The first sheet is provided to face the second surface and one of the light-emitting surface and the non-light-emitting surface provided to be flush with the second surface. The second sheet is disposed on the side opposite to the first sheet with respect to the surface-light-emitting unit and the base member, and covers the surface-light-emitting units and the electronic component. The light-emitting device is installed so that the first sheet comes to the installation surface side.

In the light-emitting device with such a structure, the first sheet is provided to face the second surface, which is disposed on the back side of the first surface to be provided with the electronic component, and one of the light-emitting surface and the non-light-emitting surface provided to be flush with the second surface. Therefore, the first sheet will not have the unevenness which would be caused by the electronic component. Since the light-emitting device is installed so that the first sheet comes to the installation surface side, the light-emitting device can be stably installed on the installation surface.

It is preferable that the first sheet and the second sheet have the flexibility. In the light-emitting device with such a structure, the first sheet and the second sheet can be deformed easily along the shape of the installation surface. Thus, the light-emitting device can be installed on the installation surface more stably.

It is preferable that the surface-light-emitting unit and the base member have the flexibility. In the light-emitting device with such a structure, the surface-light-emitting unit and the base member can be deformed easily along the shape of the installation surface. Thus, the light-emitting device can be installed on the installation surface more stably.

It is preferable that the electronic component includes at least one of the power source for supplying electric power to the surface-light-emitting unit, the control component for controlling the light emission of the surface-light-emitting unit, and the communication component used for the external communication.

In the light-emitting device with such a structure, the generation of the space between the light-emitting device and the installation surface which is caused by the unevenness due to the electronic components can be prevented.

It is preferable that the plurality of surface-light-emitting units is arrayed in the flat plane shape between the first sheet and the second sheet.

The light-emitting device with the structure in which the plurality of surface-light-emitting units is arrayed in the flat plane shape can be installed stably on the installation surface.

It is preferable that the plurality of surface-light-emitting units includes a first surface-light-emitting unit whose light-emitting surface is flush with the second surface, and a second surface-light-emitting unit whose non-light-emitting surface is flush with the second surface.

The light-emitting device with the structure as above, which can emit light from both sides, can be installed stably on the installation surface.

It is preferable that the surface-light-emitting unit is provided so that the light-emitting surface is flush with the second surface. The light-emitting device further includes another surface-light-emitting unit. This surface-light-emitting unit has a light-emitting surface and a non-light-emitting surface disposed on the back side of the light-emitting surface, emits light from the light-emitting surface, and is stacked on the surface-light-emitting unit so that the non-light-emitting surfaces thereof face each other.

The light-emitting device with the structure as above, which can emit light from both sides, can be installed stably on the installation surface.

The embodiments disclosed herein are presented for the purposes of illustration and description in all respects and are not intended to limit the subject matter described herein to the precise form disclosed. The scope of the present invention should be presented not by the above description but by the scope of claims, and the meaning equivalent to the scope of claims and all changes that come within the range are intended to be embraced therein.

INDUSTRIAL APPLICABILITY

The present invention is mainly applicable to the illuminating apparatus with the thin-plate shape.

REFERENCE SIGNS LIST

10 Light-emitting device
21, 21A, 21B, 26 Surface-light-emitting unit
21a, 26a Light-emitting surface
21b, 26b Non-light-emitting surface
30 Power source circuit unit
31 Substrate
31a Mounting surface
31b Non-mounting surface
32 Power source
41 Holding sheet
42, 47 Surface
46 Sealing sheet
51 Installation member
52 Installation surface
62, 63 Electrode portion
64 Cathode
65 Anode
66 Insulating layer
71 Sealing member
72 Transparent substrate
73 Organic layer

The invention claimed is:

1. A light-emitting device to be installed on an installation surface, comprising:
   a surface-light-emitting unit having a light-emitting surface and a non-light-emitting surface disposed on a back side of the light-emitting surface, and emitting light from the light-emitting surface;
   a base member having a first surface and a second surface disposed on a back side of the first surface and provided to be flush with one of the light-emitting surface and the non-light-emitting surface, and having an electronic component mounted on the first surface;
   a first sheet provided to face the second surface and one of the light-emitting surface and the non-light-emitting surface that is provided to be flush with the second surface; and
   a second sheet disposed on a side opposite to the first sheet with respect to the surface-light-emitting unit and the base member so as to cover the surface-light-emitting unit and the electronic component, wherein the light-emitting device is installed so that the first sheet comes to the installation surface side.

2. The light-emitting device according to claim 1, wherein the first sheet and the second sheet have flexibility.

3. The light-emitting device according to claim 1, wherein the surface-light-emitting unit and the base member have flexibility.

4. The light-emitting device according to claim 1, wherein the electronic component includes at least one of a power source for supplying electric power to the surface-light-emitting unit, a control component for controlling light emission of the surface-light-emitting unit, and a communication component used for external communication.

5. The light-emitting device according to claim 1, wherein a plurality of the surface-light-emitting units is arrayed in a plane shape between the first sheet and the second sheet.

6. The light-emitting device according to claim 5, wherein the plurality of surface-light-emitting units includes a first surface-light-emitting unit whose light-emitting surface is flush with the second surface and a second surface-light-emitting unit whose non-light-emitting surface is flush with the second surface.

7. The light-emitting device according to claim 1, wherein
the surface-light-emitting unit is provided so that the light-emitting surface is flush with the second surface, and
another surface-light-emitting unit having a light-emitting surface and a non-light-emitting surface disposed on the back side of the light-emitting surface, emitting light from the light-emitting surface, and stacked on the surface-light-emitting unit is provided so that the non-light-emitting surfaces thereof face each other.

8. The light-emitting device according to claim 2, wherein the surface-light-emitting unit and the base member have flexibility.

9. The light-emitting device according to claim 2, wherein the electronic component includes at least one of a power source for supplying electric power to the surface-light-emitting unit, a control component for controlling light emission of the surface-light-emitting unit, and a communication component used for external communication.

10. The light-emitting device according to claim 2, wherein a plurality of the surface-light-emitting units is arrayed in a plane shape between the first sheet and the second sheet.

11. The light-emitting device according to claim 2, wherein
the surface-light-emitting unit is provided so that the light-emitting surface is flush with the second surface, and
another surface-light-emitting unit having a light-emitting surface and a non-light-emitting surface disposed on the back side of the light-emitting surface, emitting light from the light-emitting surface, and stacked on the surface-light-emitting unit is provided so that the non-light-emitting surfaces thereof face each other.

12. The light-emitting device according to claim 3, wherein the electronic component includes at least one of a power source for supplying electric power to the surface-light-emitting unit, a control component for controlling light emission of the surface-light-emitting unit, and a communication component used for external communication.

13. The light-emitting device according to claim 3, wherein a plurality of the surface-light-emitting units is arrayed in a plane shape between the first sheet and the second sheet.

14. The light-emitting device according to claim 3, wherein
the surface-light-emitting unit is provided so that the light-emitting surface is flush with the second surface, and
another surface-light-emitting unit having a light-emitting surface and a non-light-emitting surface disposed on the back side of the light-emitting surface, emitting light from the light-emitting surface, and stacked on the surface-light-emitting unit is provided so that the non-light-emitting surfaces thereof face each other.

15. The light-emitting device according to claim 4, wherein a plurality of the surface-light-emitting units is arrayed in a plane shape between the first sheet and the second sheet.

16. The light-emitting device according to claim 4, wherein
the surface-light-emitting unit is provided so that the light-emitting surface is flush with the second surface, and
another surface-light-emitting unit having a light-emitting surface and a non-light-emitting surface disposed on the back side of the light-emitting surface, emitting light from the light-emitting surface, and stacked on the surface-light-emitting unit is provided so that the non-light-emitting surfaces thereof face each other.

17. The light-emitting device according to claim 5, wherein
the surface-light-emitting unit is provided so that the light-emitting surface is flush with the second surface, and
another surface-light-emitting unit having a light-emitting surface and a non-light-emitting surface disposed on the back side of the light-emitting surface, emitting light from the light-emitting surface, and stacked on the surface-light-emitting unit is provided so that the non-light-emitting surfaces thereof face each other.

18. The light-emitting device according to claim 6, wherein
the surface-light-emitting unit is provided so that the light-emitting surface is flush with the second surface, and
another surface-light-emitting unit having a light-emitting surface and a non-light-emitting surface disposed on the back side of the light-emitting surface, emitting light from the light-emitting surface, and stacked on the surface-light-emitting unit is provided so that the non-light-emitting surfaces thereof face each other.

* * * * *